Figure 6:
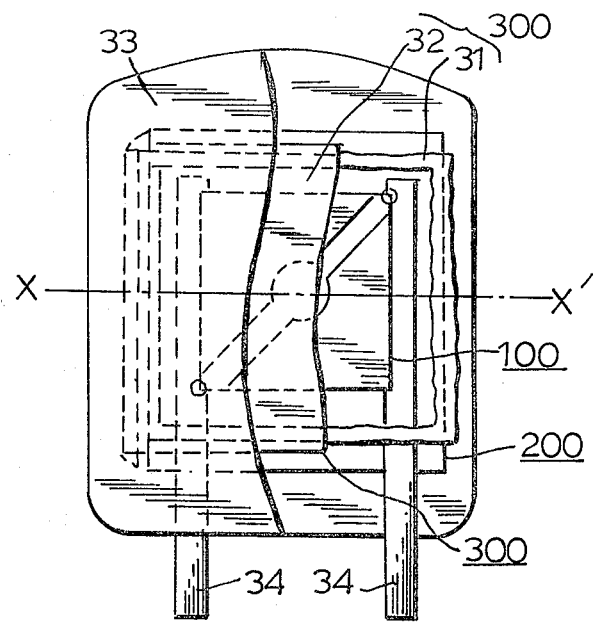
Figure 6:
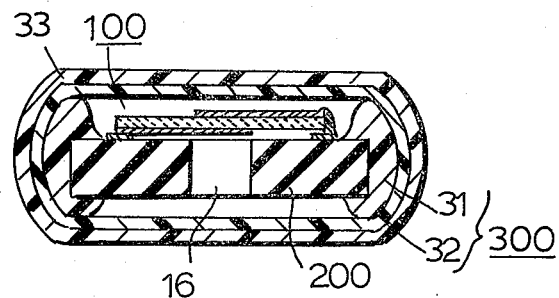

United States Patent [19]

Aizawa et al.

[11] 4,375,041
[45] Feb. 22, 1983

[54] TERMINAL SUBSTRATE FOR A QUARTZ VIBRATING DEVICE

[75] Inventors: Kimio Aizawa, Nara; Takashi Nagata, Ikeda, both of Japan

[73] Assignee: Matsushita Electric Industrial Co., Ltd., Osaka, Japan

[21] Appl. No.: 347,270

[22] Filed: Feb. 9, 1982

Related U.S. Application Data

[63] Continuation-in-part of Ser. No. 99,725, Dec. 4, 1979, abandoned.

[30] Foreign Application Priority Data

Dec. 6, 1978 [JP] Japan .................................. 53-151515

[51] Int. Cl.³ ........................................... H01L 41/08
[52] U.S. Cl. .................................... 310/348; 310/312; 310/340; 310/344; 310/342
[58] Field of Search ............... 310/312, 346, 348, 351, 310/353, 365, 340, 344, 342; 29/25, 35

[56] References Cited

U.S. PATENT DOCUMENTS

| | | | |
|---|---|---|---|
| 2,771,561 | 11/1956 | Fuller | 310/348 X |
| 3,073,975 | 1/1963 | Bigler et al. | 310/348 X |
| 4,112,324 | 9/1978 | Yamaguchi | 310/353 |

Primary Examiner—Mark O. Budd
Attorney, Agent, or Firm—Wenderoth, Lind & Ponack

[57] ABSTRACT

A quartz vibrator mounted on a terminal substrate member having a through-hole. The ratio of through hole area being from 0.5 to 0.8 of the vibrators electrode area. Fine frequency adjustment is obtained by evaporation of material thru the through hole.

2 Claims, 14 Drawing Figures

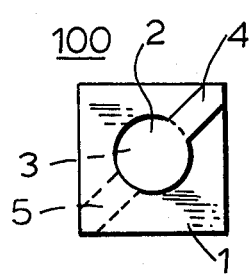
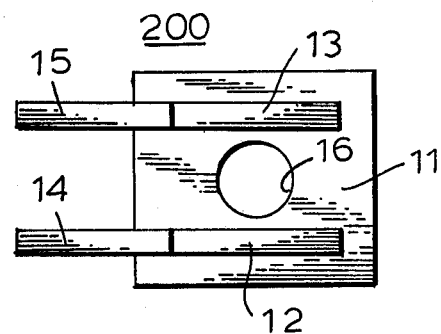
FIG.1a  FIG.2a
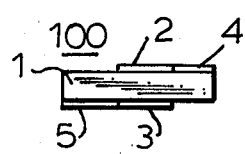
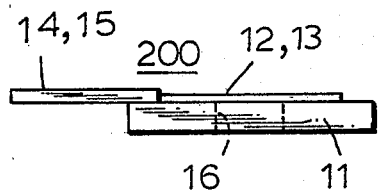
FIG.1b  FIG.2b
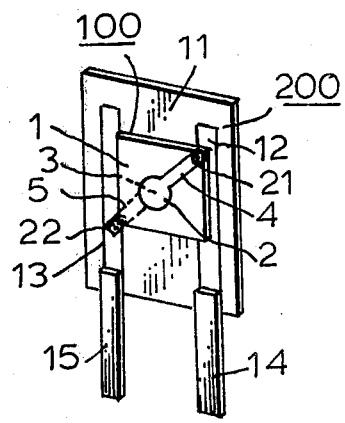
FIG.3

TERMINAL SUBSTRATE FOR A QUARTZ VIBRATING DEVICE

This application is a continuation-in-part of application Ser. No. 99,725, filed Dec. 4, 1979, now abandoned.

This invention relates a quartz vibrating device for producing a resonant vibration by the piezoelectric property of a quartz crystal.

A conventional vibrating device has a structure in which a quartz vibrating element is supported by a pair of wire springs. Therefore, it requires a lot of manual work to manufacture such a device, which is inconvenient for mass production. Further, due to the wire supporting structure, the device has a low mechanical strength. In addition, the manufacturing method is troublesome because the method comprises supporting the quartz vibrating element by a pair of wire springs, mounting on each vibrating element a mask for electrode deposition, evaporating an electrode material for the electrode on the vibrating element through the mask, finely adjusting the vibration frequency of the vibrating element by adjusting the deposition amount of the electrode material, and then removing the mask.

As improved devices, U.S. Pat. No. 4,112,324 disclosed piezoelectric vibrator units in which piezoelectric vibrator elements are encased in a holder having recesses and ports. The recesses act to fix the position-relation between the elements and the holden, and the ports are used as masking for the micro-adjustment of the vibration frequency.

In this case, it has been required to make a space between the electrode surface and the bottom surface of the holder, so as to make free vibration of the vibrator elements.

When the operating frequency becomes high and the thickness of elements becomes thin, the elements is often broken easily by an outside impact force such as dropping.

In addition, unexpected troubles often occur by the space, when the microadjusting electrode is prepared by vacuum evaporation, because the electrode surface does not closely or tightly contact to the mask. Further, thin vibration elements are often broken, when the elements are assembled on the recesses.

U.S. Pat. No. 2,771,561 and U.S. Pat. No. 3,073,975 disclose the vibrator devices of which the vibrator elements are mounted directly on the insulating substrates having conductive tracks. By these configuration, the mechanical strength is increased.

In contrast to this, the crystal impedances of the vibrator elements unavoidably increase, since the one electrode surface at which the vibration displacements become maximum have to closely or tightly contact with the substrate surface. The increase of the crystal impedance is a fundamental defect for a precise application of a piezoelectric vibrator.

It is an object of this invention to provide a quarts vibrating device having a high mechanical strength and capable of being easily manufactured.

This object is broadly achieved according to this invention by directly mounting the quartz vibrating element on a terminal substrate. More specifically, the quartz vibrating device of this invention comprises: a terminal substrate comprising an electrically insulating substrate which has a pair of conductors attached thereon and which also has a through-hole therein; and a quartz vibrating element which comprises a quartz crystal element having a pair of opposing main electrodes attached on opposite major surfaces thereof, respectively, and which also comprises a pair of lead electrodes electrically connected to said pair of main electrodes, respectively, said lead electrodes being arranged not to oppose to each other on said quartz crystal element, said quartz vibrating element being arranged on said terminal substrate in a manner such that one of said main electrodes faces said through-hole of said terminal substrate, the ratio between said through-hole area to said electrode area being from 0.5 to 0.8, said pair of lead electrodes are conductively attached to said pair of conductors on said terminal substrate, respectively, so as to integrate said terminal substrate and said quartz vibrating element, and the range of the frequency slight-adjustment by using said through-hole with the evaporation being from zero to 0.8 percent for the frequency before said evaporation.

This invention will be described in detail hereinafter with reference to the accompanying drawings in which;

FIG. 1A and FIG. 1B show an example of a quarts vibrating element 100. It is composed of a quartz crystal element 1 having a rectangular plate form (i.e. rectangular parallelopiped); a pair of main electrodes 2 and 3 each being circular in form and located on opposite major surfaces of the quartz crystal element 1 and having element 1 sandwiched therebetween in a manner such that the main electrodes face each other through the quartz crystal element; and a pair of lead electrodes 4 and 5 contiguously and electrically connected to the main electrodes on the quartz crystal element in a manner such that the lead electrodes are not opposed to each other, i.e. they are offset relative to each other.

The form of the quartz crystal element need not necessarily be a rectangular plate. Further, the form of each main electrode is not necessarily circular. FIG. 1 shows an example in which the lead electrodes 4 and 5 are formed on the quartz crystal element in a manner such that the lead electrodes extend from the main electrodes 2 and 3, respectively, in opposite directions, respectively, along a diagonal of the quartz crystal element surface. However, the lead electrodes can be arranged in other manners as long as the lead electrodes are not opposed to each other on the quartz crystal element.

As seen in FIG. 2A and FIG. 2B, the terminal substrate comprises an electrically insulating substrate 11 having a pair of conductors 12 and 13 electrically connected to the lead electrodes 4 and 5 of the quartz vibrating element 100 for supporting that lead electrodes 4 and 5, respectively. Lead terminals 14 and 15 are electrically connected, as contiguous extensions, to the conductors, 12 and 13, respectively. The insulating substrate has a through-hole 16 having a size smaller than that of each main electrode 2 and 3 of the quartz crystal element 100.

The shape of the cross section of the through-hole is preferably circular, and it is preferable that the diameter of the circle is no larger than the diameter (if each main electrode is circular) or the minimum length of each main electrode material deposited on each main electrode for fine frequency adjustment. To the same end, the center of the through-hole preferably coincides with the center of the quartz crystal element. This is to prevent or suppress a change of the static capacitance of the electrode due to fine frequency adjustment by the later electrode material deposition process. As seen in FIG. 3, the quartz vibrating device can be made by fixedly mounting the quartz vibrating element 100 on ther terminal substrate 200. The lead electrodes 4 and 5 of the quartz vibrating element 100 are bonded, for example, to the conductors 12 and 13, respectively, by an electrically conductive adhesive whereby the lead electrodes are supported. Fine adjustment of vibrating frequency of the quartz vibrating element by additional electrode material deposition can be performed on the thus prepared structure.

The position relation between the through-hole area and the main electrode area of the vibrator element is directly connected to the crystal impedance characteristics, since the electrode surfaces have maximum vibration displacements in an operating condition.

As seen in FIG. 4, the crystal impedance increases rapidly, when the through-hole area to electrode area ratio becomes less than 0.5. This means that the vibration energy of vibration element leaks greatly to the substrate, when the ratio is less than 0.5.

On the contrary, the spurious responses or the electrical capacitance of vibrator element is often badly affected after the fine frequency adjustment with using the through-hole, when the ratio is larger than 0.8. The reason is that the metal particles are deposited around the periphery of the main electrode by the detour of evaporation. As the result, the electrode area becomes large to the original electrode area and the large electrode causes the spurious responses and/or the change of the electric capacitance.

For the reason described hereinabove, it is found the through-hole area to electrode area ratio should be in the range from 0.5 to 0.8, for a satisfactory operation.

As seen in FIG. 5, the degree of the fine frequency adjustment is also closely related to the crystal impedance. In FIG. 5, the notations "$f_o$" and "$f_o'$" represent the vibration frequency before fine frequency adjustment and the vibration frequency after fine frequency adjustment, respectively.

The crystal impedance increases rapidly, when the degree of fine frequency adjustment is larger than 0.8 percent. If the thickness symmetry of each electrode of vibrator element is out of balance, the crystal impedance increases. It is found that the critical degree of fine frequency adjustment is 0.8 percent in the present application. Therefore, the degree of fine frequency adjustment should be in the range from zero to 0.8 percent for the satisfactory operation.

The thickness of the conductors 12 and 13 is usually around 10 microns, and the thickness of the lead electrodes 4 and 5 is usually around 0.5 microns. Therefore, it can be said that the quartz vibrating element 100 closely or directly contacts with the terminal substrate 200. This is more so, if surface roughnesses of the quartz vibrating element 100 and the terminal substrate 200 are taken into consideration. Because of this close or direct contact between the quartz vibrating element and the terminal substrate, the mechanical strength of the quartz vibrating device is very high. It is at least five times higher than the mechanical strength of the conventional one using a springsupported quartz vibrating element. This theory applies to other examples shown in FIGS. 6B, 9B and 10.

FIG. 6A and FIG. 6B show another example of the quartz vibrating device after the frequency fine adjustment. As shown in these drawings, this quartz vibrating device is composed of a quartz vibrating element 100, a terminal substrate 200, an insulating spacer 300 and an insulating coating 33 e.g. of resin such as epoxy resin for coating the entire structure of the device except for a portion 34 of the lead terminals 14 and 15 on the terminal substrate 200. The insulating spacer 300 comprises an adhesive (or adhesive tape) 31 provided at ends of the terminal plate 200, and an insulating film 32 to cover the device including the adhesive 31. Thereby the coating 33 does not directly contact the quartz vibrating element 100, whereby the vibration of the element is not disturbed.

Figure 10:
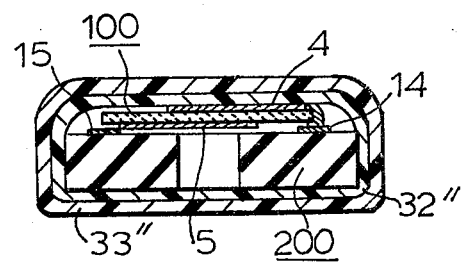

FIG. 6A and FIG. 6B show the case where the insulating film 32 does not contact the quartz vibrating element. This is preferably, but not requisite. The insulating film 32 can directly cover the device including the quartz vibrating element as shown in FIG. 10, which is practically operable.

The quartz vibrating or vibration devices according to this invention, as exemplarily described above, are superior to conventional quartz vibrating or vibration devices in the following points.

(a) For fine frequency adjustment, it is not necessary to use a conventionally used metal mask which is used only for the material deposition process and is removed after the process.

(b) It is easy to hold the quartz vibrating element. This is particularly advantageous when the quartz vibrating element is small and thin.

(c) No large housing is necessary, but rather the quartz vibrating device can be housed in a resin coating if necessary. Therefore, the thus housed device can be small and light.

(d) Since a large portion of one surface of the quartz vibrating element closely contacts the terminal substrate, except for the through-hole in the terminal substrate, the mechanical strength of the resultant device is high. It is at least five times higher than that of the conventional device using spring support method.

Figure 7:
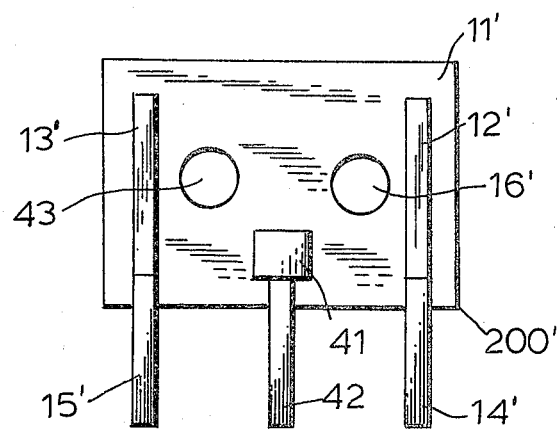
Figure 8:
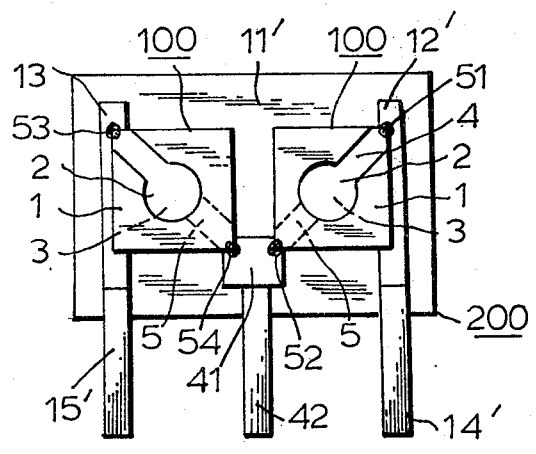

This invention is applicable to a device having plural quartz vibrating elements on one terminal substrate. FIGS. 7 to 9 show examples each using two quartz vibrating elements. In these drawings, like elements to those shown in FIGS. 1A to 6B are designated by like reference numerals. Further, primed reference numerals designate elements slightly different from those designated by corresponding unprimed reference numerals.

FIG. 7 shows a terminal substrate 200' on which two quartz vibrating elements each of FIG. 1 can be mounted. This terminal substrate 200' has a conductor 41 and a lead terminal 42 connected to and extending from the conductor 41. A through-hole 43 having the same function as that of a through-hole 16' is additionally provided.

FIG. 8 shows a quartz vibrating device using the terminal substrate 200' and having two quartz vibrating elements 100. Lead electrodes 4 and 5 of one quartz vibrating element 100 are conductively fixed to conductors 12' and 41 by a conductive adhesive 51 and 52, while lead electrodes 4 and 5 of the other quartz vibrating element 100 are conductively fixed to conductors 13' and 41 by an adhesive 53 and 54. That is, the lead electrodes 5 of the two quartz vibrating elements 100 are commonly bonded to the conductor 41.

Figure 9B:
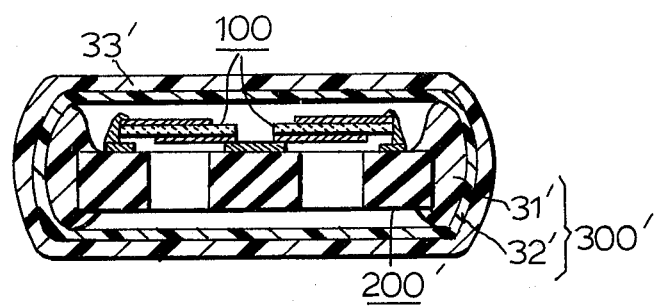
Figure 9A:
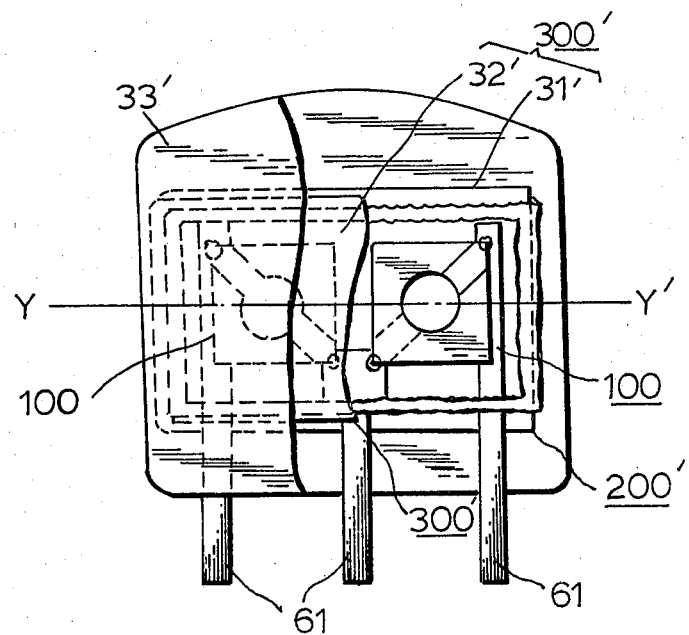

FIGS. 9A and 9B show an example of a quartz vibrating device using two quartz vibrating elements housed in one housing. According to FIGS. 9A and 9B, an insulating spacer 300' is composed of an adhesive (or adhesive tape) 31' and an insulating film 32'. The adhesive 31' is bonded to the ends of the terminal substrate 200' and supports the insulating film 32'. Thereby, the insulating film 32' covers the device without contacting the two quartz vibrating elements 100. A resin such as epoxy resin is coated on the device covered by the film 32' so as to coat all the device except for a portion 61 of the lead terminals.

The resin coating can be prepared by coating a powdered thermosetting epoxy resin on the device and heating the powdered resin. This preparation method can be applied to the above first example using a single quartz vibrating device. Further, just as in the case of the first example, the insulating film can be directly contacted to the quartz vibrating elements with or without using the adhesive.

FIG. 10 shows a quartz vibrating device which is directly wrapped by an insulating film. Referring to FIG. 10, a quartz vibrating element 100 is mounted on a terminal substrate 200 in a manner such that lead electrodes 4 and 5 are electrically connected to conductors 12 and 13. An insulating film 32'' is directly applied around the unitary body of the terminal substrate and the quartz vibrating element. On the insulating film and to cover the unitary body, an epoxy resin coating 33'' is applied.

The above described quartz vibrating device using two (or more than two) quartz vibrating elements is further advantageous as to the following points.

(e) Plural crystal vibrating elements can be more easily housed in one housing than in the case of the conventional quartz crystal vibrating device using wire spring supporters and hermetic sealing, because the plural vibrating elements can be mounted on one surface of a single terminal substrate.

(f) Since a lead terminal can be commonly used for the two quartz vibrating elements, the resultant structure can advantageously be simplified.

As described above, according to this invention, a quartz vibrating element has a pair of lead electrodes which do not oppose to or face each other, and a through-hole facing the main electrode of the quartz vibrating element is provided. A terminal substrate having conductors to be connected to the lead electrodes is used. And the position of one main electrode of the quartz vibration element facing the through-hole is adjusted relative to the position of the through-hole, and the lead electrodes of the quartz vibration element are connected to the conductors of the terminal substrate. Because of such a structure, the quartz vibration element can be directly mounted on the terminal substrate, which makes it unnecessary to use a conventionally used spring supporting structure, whereby the mechanical strengthy of the quartz vibration device can be made very high. Moreover, in the manufacturing process for manufacturing the devices, manual lavor can be greatly reduced. This leads to easier assembling of the device by using an automatic manufacturing machine. Further, since the terminal substrate can be used as a mask for additional electrode material deposition for fine adjustment of vibration frequency, the manufacturing process can be simpler thereby.

What is claimed is:

1. A quartz vibrating device comprising:

a terminal substrate having an electrically insulating substrate member having a through-hole therethrough, and a pair of conductors attached on one surface thereof in spaced relation to each other, a quartz vibrating element having a quartz crystal element having a pair of opposed main electrodes attached on opposite major surfaces thereof, and a pair of lead electrodes electrically connected to the respective ones of said pair of main electrodes, said lead electrodes being positioned in positions other than opposed to each other on said quartz crystal element; and the ratio between said through-hole area to said electrode area being from 0.5 to 0.8, said quartz vibrating element being mounted and closely contacted with on said terminal substrate with one of said main electrodes facing said through-hole in said terminal substrate, and said pair of lead electrodes being conductively fixed to the respective pair of conductors on said terminal substate, the connections of said lead electrodes and said conductors constituting the only support for said quartz vibrating element on said terminal substrate, whereby said terminal substrate and said quartz vibrating element are integrally connected, and the range of the fine-frequency adjustment by using said through-hole with the evaporation being from zero to 0.8 percent for the frequency before said evaporation.

2. A quartz vibrating device according to claim 1 wherein said insulating substrate is a ceramic substrate.

* * * * *